United States Patent [19]

Schlesinger

[11] 3,951,769

[45] Apr. 20, 1976

[54] EPOXIDE PHOTOPOLYMERIZABLE COMPOSITIONS CONTAINING CYCLIC AMIDES AS GELATION INHIBITOR AND METHODS OF POLYMERIZING

[75] Inventor: Sheldon Irwin Schlesinger, East Windsor Township, N.J.

[73] Assignee: American Can Company, Greenwich, Conn.

[22] Filed: Mar. 1, 1974

[21] Appl. No.: 447,209

[52] U.S. Cl. .................. 204/159.11; 96/91 R; 96/115 R; 96/115 P; 204/159.14; 204/159.15; 204/159.18; 204/159.22; 204/159.24; 260/2 EP; 260/2 EC; 260/2 N; 260/47 EP; 260/78.3 R; 260/343.5; 260/343.6; 260/343.9; 260/348 C; 260/348 R; 260/820
[51] Int. Cl.² ................ B01J 1/10; G03C 1/70
[58] Field of Search ............... 96/115 P, 115 R, 75, 96/91 R, 33, 36.3, 86 P, 35.1; 204/159.11, 159.14, 159.22, 159.24; 260/2 EP, 2 EC, 47 EP, 2 N, 78.3 R, 94.9 GA, 343.5, 343.6, 343.9, 348 R, 348 C, 830 TW

[56] References Cited
UNITED STATES PATENTS

| | | | |
|---|---|---|---|
| 2,826,501 | 3/1958 | Hodgins | 96/91 R |
| 3,660,097 | 5/1972 | Mainthia | 96/75 |
| 3,679,419 | 7/1972 | Gillich | 96/75 |
| 3,708,296 | 1/1973 | Schlesinger | 96/75 |
| 3,709,861 | 1/1973 | Anderson | 204/159.11 |
| 3,711,390 | 1/1973 | Feinberg | 96/91 R |
| 3,721,617 | 3/1973 | Watt | 96/91 R |
| 3,790,382 | 2/1974 | Dahlman | 96/75 |
| 3,817,845 | 6/1974 | Feinberg | 96/91 R |
| 3,817,850 | 6/1974 | Feinberg | 96/91 R |

*Primary Examiner*—Charles L. Bowers, Jr.
*Attorney, Agent, or Firm*—Robert P. Auber; Ernestine C. Bartlett; George P. Ziehmer

[57] ABSTRACT

Polymerization of epoxides and mixtures of epoxides with lactones and vinyl compounds, polymerizable through the action of cationic catalysts, is controlled by providing, in association with a radiation-sensitive catalyst precursor, a gelation inhibitor in the form of a cyclic amide in which the amide nitrogen atom contains unsubstituted hydrogen.

28 Claims, No Drawings

EPOXIDE PHOTOPOLYMERIZABLE COMPOSITIONS CONTAINING CYCLIC AMIDES AS GELATION INHIBITOR AND METHODS OF POLYMERIZING

BACKGROUND OF THE INVENTION

When a flowable liquid composition is applied to a substrate to form a coating or decoration, or to provide graphic or other information, it may be advantageous shortly after application to obtain rapid hardening, gelling, or curing of the coated material by irradiation for a brief period of time. This is particularly advantageous if the liquid coating composition is substantially free of volatile solvents which do not themselves participate in the curing, since the hardening then may be effected very rapidly without interference from evolving vapors and without producing waste gases. Practical coating systems of these types have been developed, utilizing photosensitive latent curing catalyst which respond to irradiation by releasing the catalytic agent.

One such coating system is disclosed and claimed in my U.S. Pat. No. 3,708,296 issued Jan. 2, 1973 and utilizes epoxide compounds (or mixtures) of relatively low molecular weight, which may be formulated to provide good flow characteristics with or without the use of inert solvents. Cationic polymerization catalysts cause the epoxy ring to open through cleavage of a carbon-oxygen bond, probably forming a cationic reactive intermediate. The reaction thus initiated may repeat itself rapidly many times in a chain reaction to form a polymer of repeating ether units. Gelling time for such photosensitive catalytic polymerization may be short enough to provide a substantially hardened coating a short distance after irradiation is carried out while the substrate passes at high speed along a treatment line.

However, epoxide and related compositions containing photosensitive catalytic precursors have a tendency to gel upon standing, even in the absence of light or ultraviolet radiation. This tendency to undergo premature reaction is particularly troublesome in the case of formulations which are substantially free of unreactive diluents or solvents. The polymerization reaction is exothermal and, where large masses are involved, can generate sufficient heat to cause combustion of the epoxide resins. In U.S. Pat. No. 3,721,617 issued Mar. 20, 1973 to William R. Watt and commonly assigned herewith, certain cyclic amides, free of unsubstituted hydrogen on the amide nitrogen atom, for example polyvinylpyrrolidones, are disclosed and claimed as gellation inhibitors for polymerizable compositions comprising epoxides and mixtures of epoxides with other monomers. Such compositions are photosensitive and when exposed to an energy source such as actinic radiation yield epoxy polymers which are receptive to ink and possess inherent toughness, abrasion resistance, adherence to metal surfaces, etc., but prior to such exposure are stable compositions having extended storage or potlife, premature reaction in the dark or at minimal levels of radiation being inhibited so that the mixtures may be retained for periods of days or more before application.

It has now been discovered that cyclic amides having unsubstituted hydrogen on the amide nitrogen atom may be utilized as gelation inhibitors or stabilizers for polymerizable epoxy-containing compositions and are capable of extending the pot life or storability of such compositions for extended periods.

SUMMARY OF THE INVENTION

Accordingly, new and improved stabilized polymerizable compositions comprising epoxides and mixtures of epoxides with monomers selected from the group consisting of lactones and vinyl-containing compounds are provided containing radiation-sensitive catalyst precursors and a class of gelation inhibitors which, upon admixture with the polymerizable materials, inhibit gelation of the reaction composition prior to irradiation. This is accomplished by the inclusion of a small quantity of a cyclic amide, unsubstituted in the 1-position, for example, caprolactam, as gelation inhibitors. Such compositions have greatly extended storage or potlife, premature reaction in the dark or at minimal levels of radiation being inhibited so that the mixtures may be retained for extended periods of time before application. Thus, in accordance with the process of the invention, a mixture first is formed of the polymerizable materials, a Lewis acid catalyst precursor, and the cyclic amide inhibitor. The resulting mixture, at a convenient time subsequently, is exposed to an energy source, such as actinic or electron beam irradiation, to release the Lewis acid catalyst in sufficient amounts to initiate the desired polymerization reaction.

DETAILED DESCRIPTION

Any monomeric or prepolymeric material, or mixture of such materials, of suitable viscosity or suitable miscibility in solvents, which is polymerizable to higher molecular weights through the action of a cationic catalyst, may be utilized in the process and compositions of the present invention. In a preferred embodiment, any polymerizable, monomeric or prepolymeric epoxide material or mixture of such epoxide materials, of suitable viscosity alone or when dissolved in a suitable solvent, may be utilized. The classic epoxy resin is obtained by the well know reaction of epichlorohydrin and bisphenol A (4,4'-isopropylidenediphenol). The reaction product is believed to have the form of a polyglycidyl ether of bisphenol A. Epoxide materials polymerizable in accordance with this invention are disclosed in my aforementioned U.S. Pat. No. 3,708,296 and in also U.S. Pat. No. 3,721,617 to William R. Watt issued Mar. 20, 1973 and commonly assigned herewith, such disclosure being incorporated herein by the aforegoing reference thereto.

Briefly, such epoxide materials are available in polymerizable monomeric or prepolymeric forms and include 1,2-epoxycyclohexane (cyclohexene oxide); vinylcyclohexene dioxide, ethylene oxide and its homologues generally, e.g., propylene oxide and 2,3-epoxybutane; the $C_3O$ ring compound trimethylene oxide (oxetane), derivatives thereof such as 3,3-bis(chloromethyl)oxetane; the $C_4O$ ring compound tetrahydrofuran; other epoxidized cycloalkenes such as dicyclopentadiene dioxide, more specifically identified as 3,4-8,9-diepoxytricyclo[$5.2.1.0^{2,6}$]decane; polyfunctional cyclic ethers for example 1,3,5-trioxide; vinyl epoxy monomers such as glycidyl esters of acrylic acid and of its homologs methacrylic acid and crotonic acid; allyl glycidyl ether and copolymers thereof with glycidyl methacrylate particularly as disclosed and claimed in co-pending U.S. Application, Ser. No. 297,829 filed Oct. 16, 1972,, now abandoned, as well as glycidyl phenyl ether; glycidyl alkyl ethers and mixtures thereof, for example, such mixtures containing predominantly glycidyl octyl ether and decyl glycidyl ether or containing dodecyl glycidyl ether and glycidyl tetradecyl ether; epoxidized novolak and epoxy cresol novolak prepolymers; polyolefin (e.g., polyethylene) epoxides, etc.

Esters of epoxidized cyclic alcohols, or of epoxidized cycloalkanecarboxylic acids, or of both, for example, (3,4-epoxycyclohexyl)methyl 3,4-epoxycyclohexanecarboxylate; bis[3,4,-epoxy-6-methylcyclohexyl)-methyl] adipate; diepoxide monomeric materials obtained conveniently as bis(epoxyalkyl) ethers of glycols, an example being the diglycidyl ether of 1,4-butanediol, etc.

Lactones tend to be readily polymerizable under the action of a cationic catalyst such as Lewis acid. Lactone monomers suitable for admixture in the compositions of the invention may be any lactone which is polymerizable to higher molecular weights through the action of cationic catalysts. Such lactones are described and claimed in my co-pending U.S. application Ser. No. 292,759,, now abandoned, filed Sept. 27, 1972, entitled "Photopolymerization of Lactones" and commonly assigned herewith. Lactones preferred for use in the instant compositions are cyclic esters, derived from hydroxy acids and represented by the general formula:

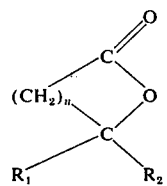

wherein $R_1$ and $R_2$ are hydrogen or alkyl, preferably lower alkyl containing 1 to 6 carbon atoms and n, the number of methylene groups, is an integer of 1–13. Such cyclic esters are derived from hydroxy acids containing between 3 to 15 carbon atoms including the beta, gamma, delta and epsilon forms of propiolactone, butyrolactone, caprolactone, pivalolactone, valerolactone, octanoic lactone, pentadecylic lactone, etc. Expecially preferred are B-propiolactone and E-caprolactone. Many of such compounds are readily available commercially or their preparation is readily had by methods known in the art, for example, by intramolecular conversion of the corresponding hydroxy acid effected by heating.

Various ethylenically unsaturated materials are likewise suitable for admixture in the present invention. The preferred compounds are vinyl compounds, containing a polymerizable

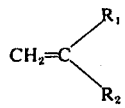

group
wherein $R_1$ and $R_2$ may be hydrogen, aryl, alkyl, alkoxy, aryloxy, carbazolyl, etc. Such compounds include styrene, alkyl and halo-substituted styrenes such as α-methyl styrene, α-chlorostyrene, ethyl styrene; o, m and p-alkyl styrenes such as 2,4-dimethyl styrene, meta-propyl styrene, dichlorostyrene, bromostyrene, etc.; vinyl ethers such as isobutyl vinyl ether, cetyl vinyl ether, vinyl methyl ether, vinyl ethyl ether, dodecyl vinyl ether, vinyl 2-chloroethyl ether, vinyl 2-ethylhexyl ether, vinyl 2-ethoxyethyl ether, vinyl methoxymethyl ether, vinyl benzyl ether, vinyl 3-phenylpropyl ether, vinyl 1-cyclohexyl ethyl ether, vinyl phenyl ether, etc; vinyl carbazoles such as N-vinyl carbazole, etc.

Such polymerizable monomer mixtures will usually contain a predominant proportion of epoxide material. In general, such mixtures will contain from about 0.25 to 98, preferably 10 to 50 parts epoxide per part of lactone or vinyl monomer.

The materials utilized as latent polymerization initiators in the process and compositions of the present invention are radiation-sensitive catalyst precursors which decompose to provide a Lewis acid upon application of energy. The energy required for effective decomposition may be energy applied by bombardment with charged particles, notably by high-energy electron beam irradiation. Preferably, however, the catalyst precursors are photosensitive, and the required energy is imparted by actinic irradiation, which is most effective at those regions of the electromagnetic spectrum at which there is high absorption of electromagnetic energy by the particular catalyst precursor used. More than one of these types of energy may be applied to the same system; e.g., ultraviolet light irradiation followed by electron beam irradiation, may be employed, although irradiation ordinarily can effect a suitable cure.

The preferred photosensitive Lewis acid catalyst precursors are aromatic diazonium salts of complex halogenides which decompose upon application of energy to release a halide Lewis acid. The aromatic diazonium cation may be represented generally as $[Ar-N\equiv N]^+$, where the aryl group Ar, which may be an alkaryl hydrocarbon group, is bonded to the diazonium group by replacing one of the hydrogen atoms on a carbon atom of the aromatic nucleus, and where the aryl group ordinarily carries at least one pendant substituent for greater stability of the cation. Thus the pendant substituent may be alkyl, or another substituent, or both. The complex halogenide anion may be represented by $[MX_{n+m}]^{-m}$. Thus, the photosensitive salt and its decomposition upon actinic irradiation may be depicted as follows:

$$[Ar\text{-}N\equiv N]^+{}_m[MX_{n+m}]^{-m} \xrightarrow{h\nu} mAr\text{-}X + mN_2 + MX_n \quad (I)$$

where X is the halogen ligand of the complex halogenide, M is the metallic or metalloid central atom thereof, m is the net charge on the complex halogenide ion, and n is the oxidation state of M and represents the number of halogen atoms in the halide Lewis acid compound released. The Lewis acid halide $MX_n$ is an electron pair acceptor, such as $FeCl_3$, $SnCl_4$, $PF_5$, $AsF_5$, $SbF_5$, $BF_3$, and $BiCl_3$, etc. which upon suitable irradiation of the diazonium complex salt is released in substantial quantities and initiates or catalyzes the polymerization process, wherein the monomeric or prepolymeric material is polymerized, crosslinked and interacted as the result of the actinic irradiation.

The diazonium compounds of the present invention may be prepared using procedures known in the art, as disclosed in U.S. Pat. No. 3,708,296 issued Jan. 2, 1972 to S. Schlesinger and commonly assigned herewith and such preparation forms no part of the present invention.

Illustrative of the aromatic diazonium cations comprised in the photosensitive catalyst salts utilized in accordance with the present invention are the following:
p-chlorobenzenediazonium
2,4-dichlorobenzenediazonium
2,5-dichlorobenzenediazonium
2,4,6-trichlorobenzenediazonium
o-nitrobenzenediazonium
p-nitrobenzenediazonium
4-nitro-o-toluenediazonium
  (2-methyl-4-nitroenzenediazonium)
6-nitro-2,4-xylenediazonium
  2,4-dimethyl-6-nitrobenzenediazonium)
2-chloro-4-(dimethylamino)-5-methoxybenzenediazonium
4-chloro-2,5-dimethoxybenzenediazonium
2,4',5-triethoxy-4-biphenyldiazonium
  (2,5-diethoxy-4-(p-ethoxyphenyl)benzenediazonium)
2,5-dimethoxy-4'-methyl-4-biphenyldiazonium
  (2,5-dimethoxy-4-(p-tolyl)benzenediazonium)
2,5-diethoxy-4-(phenylthio)benzenediazonium
2,5-diethoxy-4-(p-tolythio)benzenediazonium
p-morpholinobenzenediazonium
2,5-dichloro-4-morpholinobenzenediazonium
2,5-dimethoxy-4-morpholinobenzenediazonium
4-(dimethylamino)-naphthalenediazonium Illustrative of the complex halogenide anions comprised in the photosensitive catalyst salts utilized in accordance with the present invention are the following:
tetrachloroferrate(III), $FeCl_4^-$
hexachlorostannate (IV), $SnCl_6^{-2}$
tetrafluoroborate, $BF_4^-$
hexafluorophosphate, $PF_6^-$
hexafluoroarsenate(V), $AsF_6^-$
Hexafluoroantimonate(V), $SbF_6^-$
pentachlorobismuthate(III), $BiCl_5^{-2}$ A selection of aromatic diazonium salts of complex halogenides is listed in Table I of U.S. Pat. Nos. 3,721,617 and 3,708,292 referred to hereinabove, such disclosures being incorporated herein by the aforegoing reference thereto.

In accordance with the present invention, cyclic amides in which the amide nitrogen atom contains unsubstituted hydrogen are used in stabilizing amounts as gelation inhibitors. The discovery that cyclic amides containing hydrogen on the nitrogen atom could be effective herein was highly surprising since it had heretofore been the belief in the art that such highly labile hydrogen would cause vigorous reaction with a diazonium-catalyzed epoxide blend and therefore would not be effective as a stabilizer against premature reaction. It was for this reason that the cyclic amides of the prior art were such as to contain unreactive groups substituted on the nitrogen atom of the amide. Notable among the compounds found to be especially effective as the premature-gelation inhibitor in the process and compositions of the present invention are heterocyclic amides which may be represented by the generalized formula

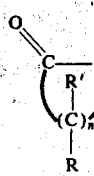

where each of R' and R is hydrogen or an unreactive group, commonly alkyl, and n is a lower integer, preferably from 3 to 11, the bond as shown to an R group alternatively may be a double bond to an adjacent carbon atom.

Turning to the $C_4N$ heterocyclic compounds of this type where $n = 3$, preferred compounds are the 2-pyrrolidinones,

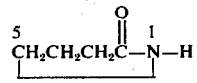

The heterocyclic ring may carry a pendant unreactive substituent (R') on one or more of the available carbon atoms (in the 3-, 4-, and 5-positions) without altering materially the functional efficiency of the N-unsubstituted cyclic amide as a gelation inhibitor.

Further examples of gelation-inhibiting cyclic amide materials having a $C_4N$ ring are 2-pyrrolin-5-ones, such as 2-methyl-2-pyrrolin-5-one,

which has a 2-methyl R' substituent with the R group in the 2- and 3-positions replaced by a double bond, and 3-pyrrolin-2-ones, such as 3-pyrrolin-2-one,

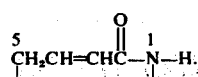

Cyclic amides having larger heterocyclic rings likewise are effective as gelation inhibitors. Thus various $C_5N$ heterocyclic amides where $n = 4$ are available and effective for such use, and other such heterocyclic amides are readily prepared. Found to be well suited for use as a gelation inhibitor, for example, is an N-unsubstituted 2(1H)-pyridone, which conveniently may be 2(1H)-pyridone,

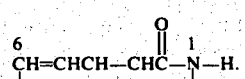

Similarly, N-unsubstituted 2-piperidones may be used, such as 2-piperidone, alternatively named δ-valerolactam.

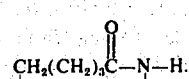

As a further example, various $C_6N$ heterocyclic amides where $n = 5$ are especially effective and constitute the preferred compounds herein. Found to be well suited for use is E-caprolactam

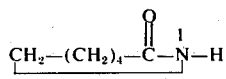

Other cyclic amides include

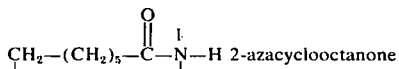 2-azacyclooctanone and

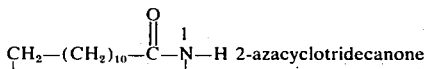 2-azacyclotridecanone

Polymeric N-unsubstituted cyclic amides may also be employed providing the amide nitrogen retains a hydrogen atom. Examples of such polymers include the polymers of vinyl substituted E-Caprolactam, also named tetrahydro-2H-azepin-2-one, which has the monomeric structure

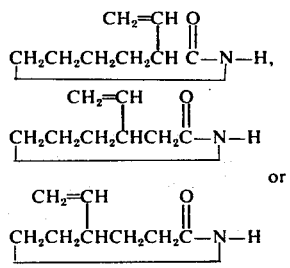

The polymers of these monomers are available and effective. Such polymers whether dimers, oligomers or of practically any degree of polymerization may be used providing they are miscible with the epoxy-diazonium formulation and providing the amide nitrogen retains a hydrogen atom.

It may be noted that all such amides are unsubstituted in the 1-position, that is, each contains a bond from the nitrogen atom of each hetero ring to a free hydrogen atom. The cyclic amides of the inventon, as a class, have numerous advantages over the prior cyclic amides when utilized as gelation inhibitors. E-caprolactam, for example, is more soluble in liquid epoxy blends than is poly(vinyl pyrrolidone) and requires no special solvent in most cases. Additionally, the cyclic amides of this invention are, in general, more economical to use, particularly since they exhibit a stabilizing effect although used in smaller quantities as discussed further hereinbelow. Further, the instant cyclic amides and especially E-caprolactam are less deliquescent than prior cyclic amides, for example PVP and therefore being less atmospheric moisture into the resin composition. This is particularly important when the compositions are employed as coatings since moisture tends to retard curing of the liquid epoxide coating to a solid.

Referring to equation I hereinabove showing the photolytic decomposition of the catalyst precursor, the halide Lewis acid $MX_n$ released reacts with the epoxide or other polymerizable material with a result exemplified by the following:

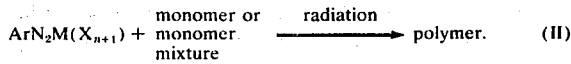

The cationic catalyst is believed to act by cleaving a carbon-oxygen epoxy or lactone bond, or by opening the double bond in a vinyl (ethylenic) monomer, initiating growth of a polymeric chain or permitting formation of a cross-linkage. A general application of the process embodied by equations I and II can be as follows: a diazonium complex salt, for example, as identified hereinabove, is admixed, with or without the use of a suitable solvent, with an epoxy monomer or epoxy monomer in admixture with a lactone or vinyl monomer and a quantity of cyclic amide stabilizer. The mixture is thereafter coated on a suitable substrate such as a metal plate, plastic, or paper, and the substrate is exposed to ultraviolet or electron beam radiation. On exposure the diazonium compound decomposes to yield the Lewis acid catalyst, which initiates the polymerization of the epoxy monomer or mixture of monomers. The resulting polymer is resistant to most solvents and chemicals.

The source of radiation for carrying out the method of the present invention can be any suitable source, such as the ultraviolet actinic radiation produced from a mercury, xenon, or carbon arc, or the electron beam produced in a suitably evacuated cathode ray gun. The only limitation placed on the radiation source used is that it must have an energy level at the irradiated film sufficient to impart to the polymerizable system energy at an intensity high enough to reach the decomposition level of the photosensitive compounds. As previously noted, the wavelength (frequency) range of actinic radiation is chosen to obtain sufficient absorption of energy to excite the desired decomposition.

For an imaging system, the mixture, which may contain a suitable solvent in substantial proportions, is coated on a metal plate, dried if necessary to remove solvent present, and the plate is exposed to ultraviolet light through a mask or negative. The light initiates polymerization which propagates rapidly in the exposed image areas. The resulting polymer in the exposed areas is resistant to many or most solvents and chemicals, while the unexposed areas can be washed with suitable solvents to leave a reversal image of the polymer in this embodiment.

The polymers produced by the polymerizing process of the present invention are useful in a wide variety of applications in the field of graphic arts, due to their superior adhesion to metal surfaces, excellent resistance to most solvents and chemicals, and capability of forming high resolution images. Among such uses are photoresists for chemical milling, gravure images, offset plates, stencilmaking, microimages for printed circuitry, thermoset vesicular images, microimages for information storage, decoration of paper, glass, and packages, and light-curable coatings.

The procedures for mixing the stabilized radiation-sensitive compositions of the present invention using the polymerizable materials are relatively simple. The polymerizable mixture is combined with the catalyst precursor and the inhibitor, if desired with a suitable inert volatile solvent. By such a suitable solvent is meant any solvent compound or mixture which boils below about 190°C and which does not react appreciably with the polymerizable material, the catalyst precursor, or the inhibitor. Examples of such solvents include acetone, toluene, methyl ethyl ketone, ethyl ether, anisole, dimethyl ether of diethylene glycol (bis(2-methoxyethyl)ether), monochlorobenzene, 1,1,2,2-tetrachloroethane, o-chlorotoluene, o-dichlorobenzene, and trichloroethylene or mixtures thereof.

The amount of catalyst precursor employed should be sufficient to insure complete polymerization. It has been found that quite satisfactory results are obtained by providing a diazonium complex salt in amount by weight from about 0.5% to about 5% of the catalyst precursor relative to the weight of the polymerizable material provided, about 1% or less being amply effective with some monomer-catalyst precursor systems.

The amount of the cyclic amide needed for the desired stabilizing effect is determined readily for given ingredients, and may vary within a considerable range as long as the curing rate, upon exposure of the composition to irradiation, is not disadvantageously reduced by the proportion of the inhibitor present. Such amount may be determined using simple tests performed quite readily by the skilled formulator, preferably covering a range of test proportions to determine storage or pot life as a function of inhibitor proportion. A convenient test procedure involves viscometer measurements after storage in the dark for a period as long as the maximum storage life needed for the operations in which the stabilized mixed polymerizable compositon is to be used. Most coating and printing operations, for example, can utilize formulations having a viscosity within a substantial pre-determined range, whether a relatively low-viscosity or high-viscosity range, and use of the inhibitor can maintain the formulations within the desired viscosity range for a much longer period. The viscosity of the freshly prepared mixture, even if solvent free, is low enough in some cases to permit substantial polymerization before the composition becomes too viscous to be usable.

The examples set out hereinbelow will indicate the range of proportions within which the inhibitor usually is required. As little as 5% mole of the cyclic amide relative to the molar concentration of the cationic initiator in the polymerizable composition can be markedly effective for several days of storage, while amounts of the inhibitors over 65% mole seldom are needed. In general, the inhibitor preferably is present in an amount by weight equal to between about 15% mole and about 40% mole of the cationic initiator (catalyst precursor) present in the composition. It should be kept in mind that unnecessarily large amounts of inhibitor can decrease quite markedly the catalytic potential of the catalyst precursor, and may poison the catalyst to the extent that substantial or sufficient curing cannot occur in a reasonable length of time after application of energy to the composition. For this reason, provision of the inhibitors in great excess of suitable stabilizing amounts should be avoided.

As suggested hereinabove, many cyclic amides may be used which provide the desired end properties of the polymerizable composition as utilized in the polymerizing process of the invention. Of course, in confirming the inert character of the substituted inhibitor, the absence of any substantial deleterious effects on the other constituents of the polymerizable composition need be ascertained only in the presence of the small stabilizing amount of the inhibitor to be used, and over a period of time commensurate with the desired storage or pot life of the composition.

The catalyst precursors listed hereinabove are solids, and the inhibitors utilized in accordance with the present invention also may be solids at room temperature. While it may be possible to dissolve such solid ingredients in one or more of the polymerizable ingredients making up the epoxide or other polymerizable material utilized in the composition, it usually is more convenient for mixing purposes to provide the solid ingredients for the mixing operation already dissolved in a solvent. The use of a small amount of a solvent medium such as acetone, anisole or propylene carbonate often is convenient for introducing liquid additives miscible in the medium, as well as solid additives. It has been found that certain of the cyclic amides herein, for example E-caprolactam, are more soluble in liquid epoxy resins than are the cyclic amide stabilizers of the prior art such as poly(vinylpyrrolidone) and require no special solvents in most cases. Additionally, it appears that much smaller amounts of the unsubstituted cyclic amides may be employed to have a stabilizing effect as pointed out hereinabove. If desired to avoid substantially the disadvantages of utilizing an inert solvent medium, the total amounts of any solvents which do not participate in the polymerization reactions, including a solvent such as propylene carbonate and particularly any volatile solvents present, should be kept below about 4% by weight.

It may be desirable, however, to include in the composition an inert pigment or filler, which may be present in even a major proportion by weight, or small amounts of inert nonvolatile liquids such as mineral oil. Inclusion of such inert ingredients usually makes advisable a proportionate increase in the optimum amount of catalyst precursor used. Nevertheless, the precursor needed rarely exceeds 5% of the entire weight of the composition, and an amount of the inhibitor less than about 1.5% of the total weight usually is sufficient.

The following examples will serve further to illustrate the present invention.

EXAMPLE I

Three epoxide blends, A, B and C were formulated to contain equal amounts of p-chlorobenzene diazonium hexafluorophosphate and varying amounts of caprolactam. A fourth formulation, D, served as a control with no caprolactam added.

| | Formulation, grams | | | |
|---|---|---|---|---|
| | A | B | C | D |
| Epoxy Resin | | | | |
| 1) 1,4-butanediol diglycidyl ether | 25.0 | 25.0 | 25.0 | 25.0 |
| 2) 3,4-epoxycyclohexylmethyl-3,4-epoxycyclohexane carboxylate | 25.0 | 25.0 | 25.0 | 25.0 |
| 3) p-chlorobenzenediazonium hexafluorophosphate | 0.500 | 0.500 | 0.500 | 0.500 |
| 4) caprolactam | 0.0164 | 0.0323 | 0.0643 | — |

Within 2 hours, an exothermic reaction began in formulation D, with gelling commencing. This formulation finally set to a hard solid within four hours.

Formulation A gelled to a solid within two days, while formulations B and C gelled within 5 days. Coatings were cast with formulations A to C, after aging for one day, on paperboard samples using a No. 9 wire-wound rod. Upon exposure to a 360W mercury arc ultraviolet lamp for 15 seconds at 18 cm. distance, coatings derived from formulations B and C cured to dry, hard, glossy coatings. Coatings derived from formulation A also cured to a dry, hard glossy coating but with a minimum of five seconds of exposure.

EXAMPLE II

A blend of epoxy resins was prepared as follows:

| Epoxy Resin | Viscosity (25°C) Centipoises | Epoxy Value | Parts by Weight |
|---|---|---|---|
| (1) Diglycidyl ether of bis-phenol A | 4000–6000 | 0.57 | 200 |
| (2) (3,4-epoxycyclohexyl)-methyl 3,4-epoxycyclo-hexanecarboxylate | 275 | 0.72 | 100 |
| (3) Alkyl glycidyl ether in which alkyl groups are predominantly n-dodecyl and n-tetradecyl | 8.5 | 0.39 | 30 |

Aliquots of 100 grams each were removed. To the first was added 1.0 grams of p-chlorobenzenediazonium hexafluorophosphate and 0.0426g caprolactam. To the second was added 1.0 grams of p-chlorobenzenediazonium hexafluorophosphate, and 0.1208 grams of caprolactam. The samples were stored at room temperature under ambient light conditions for the period of time indicated below. Periodically the viscosity was measured by means of a Brookfield viscometer and the viscosity was recorded. The results are reported below in the Table which follows:

Table I

| No. Days Elapsed | Viscosity, cps Sample A | Viscosity, cps Sample B |
|---|---|---|
| 1 | 945 | 840 |
| 6 | 6,686 | 2,374 |
| 8 | 17,397 | 4,318 |
| 18 | Gelled | Gelled |

A similar formulation without caprolactam gelled within one day.

EXAMPLE III

This example illustrates the difference in deliquenscence of a cyclic amide of this invention as compared to a prior art cyclic amide.

Samples of poly(vinylpyrrolidone), (A) and E-caprolactam (B) were weighed into separate dishes and left exposed to the atmosphere for 40 hours. Weighings of each sample were made at different times over the 40 hour period. The initial and subsequent weights were as indicated below:

| Time, hours | Weight of Sample (A) gram | % Weight Change | Weight of Sample (B) grams | % Weight Change |
|---|---|---|---|---|
| 0 (Initial) | 3.01234 | — | 3.03049 | — |
| 16 | 3.21599 | +6.76 | 3.02078 | −0.32 |
| 24 | 3.27959 | +8.87 | 3.01957 | −0.36 |
| 40 | 3.30217 | +9.62 | 3.01915 | −0.37 |

Thus, after 40 hours, the PVP sample (A), showed a weight gain of +9.62% and changed in state from a dry white powder to a moist paste. The caprolactam sample showed a slight weight loss but remained a dry white powder. The weight gain is attributable only to moisture absorbed from the atmosphere. When used in cationically initiated systems, the deliquenscence of PVP is a disadvantageous property since moisture has an inhibiting effect on the curing rate of the epoxy-diazonium system. The non-deliquescent nature of the E-caprolactam is therefore a significant and advantageous property when used according to this invention.

EXAMPLE IV

Three formulations were prepared by dissolving 0.00050 mole of a cyclic amide in a 100 g portion of a 1:1 mixture of epoxides (1) and (2) of Example I. A fourth formulation was prepared as a control, with no cyclic amide. Into each of these formulations was dissolved 0.700 g (0.00250 mole) of p-methoxybenzenediazonium hexafluorophosphate. The completed formulations with cyclic amide therefore contained 20 mole-% of amide, based on the diazonium salt. The four formulations are identified below:

A. with 0.0496 g δ-valerolactam
B. with 0.0426 g 2-pyrrolidinone
C. with 0.0636 g 2-azacyclooctanone
D. no cyclic amide (control)

The resulting solutions were stored at room temperature in the absence of actinic light, and their viscosities were determined over a period of time. Table II summarizes the time elapsed when the viscosity of a formulation increased to double its original value, and the approximate time to gelation.

Table II

| Formulation | Cyclic Amide | Original Viscosity, cps, 25°C | Time to Double Viscosity, Hours | Gelation Time, Hrs. |
|---|---|---|---|---|
| A | δ-valerolactam | 58.69 | 250 | 360 |
| B | 2-pyrrolidinone | 58.74 | 335 | 500 |
| C | 2-azacyclo-octanone | 59.80 | 370 | 600 |
| D | None | 59.34 | 27 | 384 |

In each case, the cyclic amide resulted in an extension of the time elapsed before the viscosity doubled, and, with the exception of A, extended the time elapsed before gelation.

The mercury arc exposure time required to cure coatings made with these formulations did not vary significantly as they aged. Exposure tests made at 15 cm distance from a 360 W Uviarc lamp on paperboard coatings drawn with a No. 6 wire-wound rod, indicated the requirements for curing to a hard tack-free surface, as indicated in Table III.

Table III

| Formulation | Initial Required Exposure, Sec. | Exposure Required After 2 Weeks, Sec. |
|---|---|---|
| A | 10 | 10 |
| B | 10 | 7 |
| C | 10 | 8 |
| D | 12 | — |

EXAMPLE V

The experiments of Example IV were repeated with twice the amount of cyclic amide added, so that the amide was present as 40 mole-% of the diazonium compound. These results are summarized in Table IV.

Table IV

| Formulation Designation | Cyclic Amide | Original Viscosity, cps, 25°C | Time to Double Viscosity Hrs. | Gelation Time, Hrs. |
|---|---|---|---|---|
| A | δ-valerolactam | 58.03 | 233 | 450 |
| B | 2-pyrrolidinone | 57.77 | 383 | 576 |
| C | 2-azacyclooctanone | 58.49 | 365 | 790 |
| D | None | 59.34 | 27 | 384 |

At this concentration level, all of the cyclic amides caused an extension of both gelation time and time to double viscosity. The exposure-curing results were similar to those of Example IV.

EXAMPLE VI

Two formulations, A and B, were prepared to contain 0.0986 g (0.000500 mole), and 0.1972 g (0.00100 mole), respectively, of 2-azacyclotridecanone in 100 g of a 1:1 mixture of the epoxides of Example IV. To each formulation was added 0.700 g of p-methoxybenzenediazonium hexafluorophosphate. The resulting mole-% of amide based on diazonium salt was 20 mole-%, and 40 mole-% for A and B, respectively. The formulations were stored and evaluated as in Example IV. Viscosity and gelation data are given in Table V.

Table V

| Formulation | Original Viscosity, cps, 25°C | Time to Double Viscosity Hrs. | Time to Gelation, Hrs. |
|---|---|---|---|
| A | 58.95 | 315 | 700 |
| B | 58.69 | 385 | 700 |

Comparison with control formulation D of Example IV again indicates the effectiveness of this cyclic amide as a gelation inhibitor and extender of time to double viscosity. Comparative exposure-curing tests made at the time of mixing, and after 3 weeks indicated no appreciable change from the 8-10 seconds required originally.

EXAMPLE VII

A formulation was prepared to contain 0.119 g of 2-pyrrolidinone (0.00140 mole) and 1.0 g of p-chlorobenzenediazonium hexafluorophosphate (0.00350 mole) in 100 g of the epoxide blend of Example II consisting of 200 parts of Epoxide (1), 100 parts of Epoxide (2) and 30 parts of Epoxide (3), respectively. The formulation was stored and evaluated as with Example IV. The initial viscosity was 764.4 cps at 25°C. The time elapsed to double viscosity was 230 hrs., while gelation occurred after 550 hrs. A control sample with no cyclic amide gelled within 16 hrs.

It will be seen from the aforegoing examples that various cyclic amides, in which the amide nitrogen atom is unsubstituted are effective in prolonging the shelf-life, afford control of viscosity build-up and inhibit gelation of photopolymerizable epoxide systems.

It is thought that the invention and many of its attendant advantages will be understood from the foregoing description and it will be apparent that various changes may be made in the matter of the ingredients, their identity and their proportions and in the steps of the process and their order of accomplishment without departing from the spirit and scope of the invention or sacrificing all of its material advantages, the form hereinbefore described being merely a preferred embodiment thereof.

What is claimed is:

1. A stabilized polymerizable composition, comprising a polymerizable material consisting essentially of:
   a major proportion of a monomeric or prepolymeric epoxide, mixtures thereof or mixture thereof with a monomer selected from the group consisting of lactones and vinyl-containing compounds, said mixture being polymerizable to higher molecular weights through the action of a cationic catalyst;
   a radiation-sensitive catalyst precursor which decomposes upon application of energy to provide a Lewis acid effective to initiate polymerization of said polymerizable material, said precursor being an aromatic diazonium salt of a complex halogenide and present in an amount sufficient to effect said polymerization;
   and a stabilizing amount of a monomeric gelation inhibitor for counteracting prematurely formed Lewis acid, said inhibitor being selected from compounds of the general formula

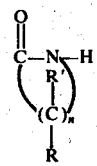

R' is hydrogen or an unreactive group; R is hydrogen, an unreactive group, or a double bond to an adjacent carbon atom; and n is an integer of 3 to 11; said stabilizing amount of the inhibitor being substantially inert to said polymerizable material and said catalyst precursor.

2. The composition of claim 1, in which the monomeric or prepolymeric epoxide is a mixture of epoxides.

3. The composition of claim 1, in which the polymerizable material is a mixture of epoxides and a lactone.

4. The composition of claim 3, in which said lactone is propiolactone.

5. The composition of claim 1, in which the polymerizable material is a mixture of epoxides and a vinyl-containing compound.

6. The composition of claim 5, in which said vinyl-containing compound is selected from compounds having the general formula

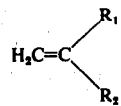

wherein $R_1$ and $R_2$ are selected from the group consisting of hydrogen, alkyl, alkoxy, aryl, aryloxy, halogen, haloalkyl and haloaryl.

7. The composition of claim 1, in which said catalyst precursor is present in an amount equal to between about 0.5% and about 5% of the weight of said polymerizable material present in the composition.

8. The composition of claim 1 in which n is 3.
9. The composition of claim 1 in which n is 4.
10. The composition of claim 1 in which n is 5.
11. The composition of claim 1 in which n is 6.
12. The composition of claim 1 in which n is 11.

13. The composition of claim 1 in which said cyclic amide is selected from the group consisting of E-caprolactam, 2-pyrrolidinone, δ-valerolactam, 2-azacyclooctanone and 2-azacyclotridecanone.

14. The composition of claim 1, in which said gelation inhibitor is present in an amount by weight equal to between about 5% mole and about 65% mole based on the molar concentration of the catalyst precursor.

15. The composition of claim 1, in which the total amount of any unpolymerizable volatile solvents present in said composition is less than about 4% by weight of the composition.

16. The process of polymerizing a polymerizable material consisting essentially of a major proportion of a monomeric or prepolymeric epoxide, mixtures thereof or mixtures thereof with a monomer selected from the group consisting of lactones and vinyl-containing compounds, said mixtures being polymerizable to higher molecular weights through the action of a cationic catalyst, comprising:

forming a mixture of a polymerizable material with a radiationsensitive catalyst precursor which decomposes upon application of energy to provide a Lewis acid effective to initiate polymerization of said polymerizable material, said precursor being an aromatic diazonium salt of a complex halogenide and present in an amount sufficient to effect said polymerization, and with a stabilizing amount of a monomeric gelation inhibitor for counteracting prematurely formed Lewis acid, said inhibitor being selected from compounds of the general formula

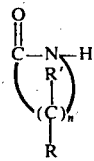

R' is hydrogen or an unreactive group; R is hydrogen, an unreactive group, or a double bond to an adjacent carbon atom; and n is an integer of 3 to 11 said stabilizing amount of the inhibitor being substantially inert to said polymerizable material and said catalyst precursor and subsequently applying energy to the resulting mixture to release said Lewis acid in sufficient amounts to effect substantial polymerization of the polymerizable material.

17. The process of claim 16, in which the monomeric or prepolymeric epoxide is a mixture of epoxides.

18. The process of claim 16, in which the polymerizable material is a mixture of epoxides and a lactone.

19. The process of claim 16, in which the polymerizable material is a mixture of epoxides and a vinyl-containing compound.

20. The process of claim 16, in which said vinylcontaining compound is selected from compounds having the general formula

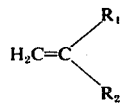

wherein $R_1$ and $R_2$ are selected from the group consisting of hydrogen, alkyl, alkoxy, aryl, aryloxy, halogen, haloalkyl and haloaryl.

21. The process of claim 16, in which said catalyst precursor is mixed with said polymerizable material in an amount equal to between about 0.5% and about 5% of the weight of the polymerizable material.

22. The process of claim 16, in which $n$ is 3.

23. The process of claim 16, in which $n$ is 4.

24. The process of claim 16, in which $n$ is 5.

25. The process of claim 16, in which $n$ is 6.

26. The process of claim 16, in which $n$ is 11.

27. The process of claim 16, in which said cyclic amide is selected from the group consisting of E-caprolactam 2-pyrrolidinone, δ-valerolactam, 2-azacyclooctanone and 2-azacyclotridecanone.

28. The process of claim 16 in which said gelation inhibitor is mixed with said polymerizable material and said catalyst precursor in an amount equal to between about 5% mole and about 65% mole based on the molar concentration of the catalyst precursor.

* * * * *